(12) United States Patent
Tanaka et al.

(10) Patent No.: US 6,493,125 B1
(45) Date of Patent: Dec. 10, 2002

(54) APPARATUS FOR STABILIZING LIGHT SOURCE FREQUENCY

(75) Inventors: Kazuo Tanaka, Tokyo (JP); Yukihiro Ozeki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/257,369

(22) Filed: Feb. 25, 1999

(30) Foreign Application Priority Data

Feb. 25, 1998 (JP) .......................................... 10-060483

(51) Int. Cl.[7] .......................... H04B 10/04; H01S 3/13; H01S 3/04
(52) U.S. Cl. ............... 359/187; 372/29.011; 372/29.02; 372/29.023; 372/32; 372/34
(58) Field of Search .................... 359/187; 372/29.011, 372/29.02, 29.023, 32, 34

(56) References Cited

U.S. PATENT DOCUMENTS

| | | | | |
|---|---|---|---|---|
| 4,926,429 A | * | 5/1990 | Chung | 372/32 |
| 5,204,640 A | * | 4/1993 | Logan, Jr. | 331/9 |
| 5,381,230 A | * | 1/1995 | Blake et al. | 356/345 |
| 5,646,774 A | * | 7/1997 | Takara et al. | 359/340 |
| 5,687,261 A | * | 11/1997 | Logan | 385/24 |
| 5,717,708 A | * | 2/1998 | Mells | 372/32 |
| 5,991,477 A | * | 11/1999 | Ishikawa et al. | 385/24 |
| 6,078,418 A | * | 6/2000 | Hansen et al. | 359/161 |

OTHER PUBLICATIONS

"Characteristics of optical senders' frequency stabilizer employing a Mach–Zehnder filter under real environment" Sakamoto Et Al. The Institute of Electronics and Communications Engineers B–10–216, 1997.

* cited by examiner

Primary Examiner—Jason Chan
Assistant Examiner—David C Payne
(74) Attorney, Agent, or Firm—Venable; Robert J. Frank

(57) ABSTRACT

The WDM light source comprises a light source which generates an optical signal for an optical channel. The optical signal is intensity modulated with modulating signals. The modulated optical signal is applied to a dispersion generating circuit, at which dispersion occurs on the optical signal, according to the wavelength of the signal. A phase difference detector detects phase difference between the optical signal input to the dispersion generating circuit and the optical signal output from the dispersion generating circuit. According to the detected phase difference, the control signal which corresponds to delay time is generated. The control signal is fed back to the light source thus the wavelength of the light source is controlled.

10 Claims, 15 Drawing Sheets

APPARATUS FOR STABILIZING LIGHT SOURCE FREQUENCY

BACKGROUND OF THE INVENTION

1. Field of the Invention

This invention relates to an apparatus for stabilizing frequency of a light source which is utilized in wavelength division multiple (Wavelength Division Multiplex. Hereinafter, referred to as WDM) optical communication.

2. Description of Related Art

In the optical communication field, it is required to enlarge transmission capacity. In order to enlarge transmission capacity, the conventional apparatus multiplex electrical signal (frequency division multiplex or time division multiplex), or increases numbers of optical fibers. Thus, total amount of transmission is enlarged.

However, such demand for large transmission capacity grows rapidly. For this reason, development of WDM optical communicative technique is advanced in recent years. For this WDM optical communication, a WDM light source which generates an optical wavelength division multiplexed signal is used. Outputs of the WDM light sources is inputted into an optical fiber. Thus, a plurality of transmission paths can be configured in an optical fiber, and it becomes possible to meet the demand. Here, the technique for increasing higher stability for frequency of WDM light source should be indispensable.

For example, a technique disclosed in, Sakamoto et al, "Characteristics of optical senders' frequency stabilizer employing a Mach-Zehnder filter under real environment", The Institutes of Electronics, Information and Communication Engineers B-10-216, 1997, has been proposed. In this document, frequency of WDM light source is adjusted to one of peak frequency of mach-zehnder filter.

By the way, when a mach-zehnder filter is used, an attention should be paid on the following in order to make frequency of WDM light source be stable:

1. A mach-zehnder filter has characteristics in which pass band and stop band repeatedly appears with equal band. But in actual apparatus, center frequency of the bands may sometimes slip from designed frequency by an error on manufacture or a polarization dependency. Therefore, frequencies of the plural light sources may not match the center frequencies of the each band of the filter.
2. Because of the above-mentioned characteristics of the mach-zehnder filter, frequency of each light source can not be chosen freely.
3. Frequency of WDM light source needs to be led to a center frequency of the mach-zehnder filter. For this reason, voltage is applied at the filter, and thus the characteristics of the filter should be dizzered.

SUMMARY OF THE INVENTION

Accordingly, it is the object of this invention to provide WDM light source which does not use the Mach-zehnder filter.

It is another object of this invention to provide WDM light source with frequency of each light source becomes more stable, and thus more efficient and precise control can be achieved.

It is further object of this invention to provide WDM light source with reduced circuit scale.

According to the first aspect of the invention, the WDM light source comprises a light source which generates an optical signal for an optical channel. The optical signal is intensity modulated with modulating signals, the signal is assigned to each channel. The modulated optical signal is applied to a dispersion generating circuit, at which dispersion occurs on the optical signal, according to the wavelength of the signal. The WDM light source further comprises a phase difference detector which detects phase difference between the optical signal input to the -dispersion generating circuit and the optical signal output from the dispersion generating circuit. According to the detected phase difference, the WDM light source generates control signal which corresponds to delay time. The control signal is fed back to the light source thus the wavelength of the light source is controlled. As a result, the wavelength is stabilized within the predetermined range.

According to the another aspect of the invention, the WDM light source comprises a plurality of light sources, each generates an optical signal for an optical channel. The optical signals are intensity modulated with modulating signals, the signal is assigned to each channel. The optical signals are duplexed and applied to a dispersion generating circuit, at which dispersion occurs on the optical signal, according to the wavelength. The control signal is generated for each light source according to the each detected phase difference, and the control signal is fed back to the light source thus the wavelength of the light source is controlled. As a result, the wavelength is stabilized within the predetermined range.

According to the yet another aspect of the invention, the WDM light source comprises a plurality of light sources, each generates an optical signal for an optical channel. The WDM light source further comprises switching element that selects one of the optical signal among the plurality of optical signals. The selected optical signal is fed to a modulator which intensity modulates the optical signal with modulating signals, the signal is assigned to each channel. The modulated optical signals applied to a dispersion generating circuit, at which dispersion occurs on the optical signal, according to the wavelength. The control signal is generated for each light source according to the detected phase difference, and the control signal is fed back to the light source thus the wavelength of the light source is controlled. As a result, the wavelength is stabilized within the predetermined range.

BRIEF DESCRIPTION OF THE DRAWINGS

FIG. 9(a) shows the block diagram, while

FIG. 11(a) shows DC output characteristics of the phase difference detector of the modified fifth embodiment, while

DESCRIPTION OF THE PREFERRED EMBODIMENTS

Figure 1:
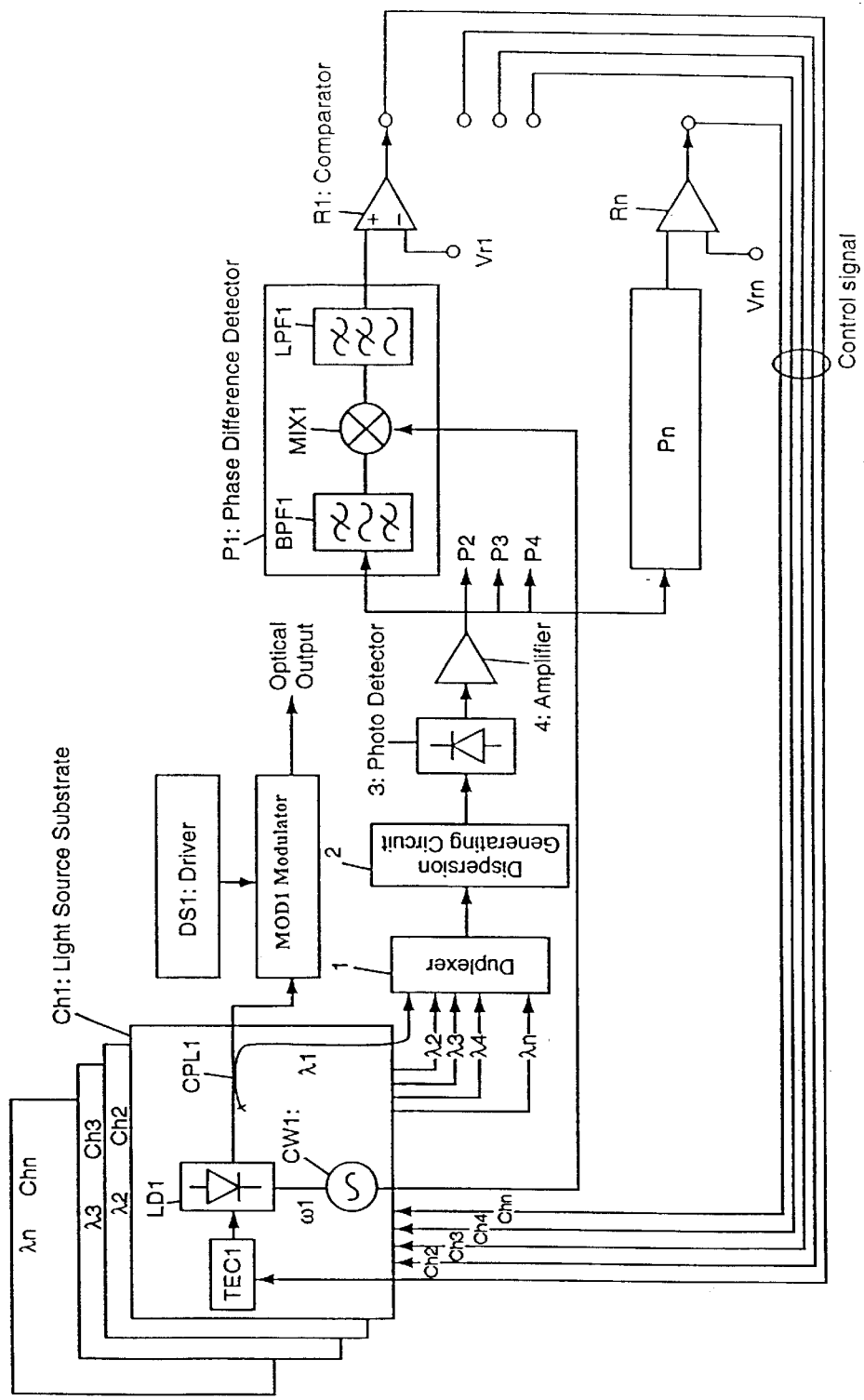
FIG. 1 shows a block diagram of the first preferred embodiment of this invention.

The preferred embodiments of this invention are explained hereinbelow. First, FIG. 1 shows a block diagram of the first preferred embodiment of this invention. In FIG. 1, a WDM light source generates n-multiplexed optical signal, in which n-channels are multiplexed. This multiplexed optical signal represents optical wavelength division multiplexed signal. For producing the optical wavelength division multiplexed signal, the WDM light source has n light source substrates Ch1 to Chn. Each light source substrate generates an optical signal for each channel, respectively.

For example, a light source LD1 which generates an optical signal of wavelength $\lambda 1$ is mounted on the light source substrate Ch1. The light source substrate Ch1 further has a temperature control circuit TEC1 and a modulating signal generator CW1. The output of the temperature control circuit TEC1 is fed to the light source LD1. The temperature control circuit TEC1 controls the temperature of the light source LD1. Thus, laser frequency of the light source LD1 varies. Such mechanism will be explained hereinafter in detail.

The modulating signal generator CW1 applies a sine wave with predetermined angle speed $\omega 1$ to the light source LD1. The angle speed $\omega 1$ is assigned to the first channel. As a result, the optical signal from the light source LD1 is intensity modulated. This modulated optical signal is applied to a modulator MOD1. At the same time, part of the modulated optical signal is divided at a coupler CPL1 and is given to a duplexer 1.

A driver DS1 is coupled to the modulator MOD1. The modulator MOD1 modulates the modulated optical signal by transmission data, which is applied from the driver DS1.

The remaining light source substrate Ch2 to Chn has similar configuration to that of the light source substrate Ch1. For example, the light source substrate Ch2 has a light source LD2, a temperature control circuit TEC2, a modulating signal generator CW2, and a coupler CPL2. Here, the light source LD2 generates an optical signal of wavelength $\lambda 2$. And, the modulating signal generator CW2 applies a sine wave with predetermined angle speed $\omega 2$ to the light source LD2. The angle speed $\omega 2$ is assigned to the second channel. The light source substrate Ch3 to Chn has similar configuration. Further, though they are not shown in FIG. 1, the WDM light source has modulators MOD2 to MODn, and drivers DS2 to DSn, each corresponds to Ch2 to Chn.

Each output from the modulator MOD1 to MODn are multiplexed. In other words, a plurality of optical signals of wavelength $\lambda 1$ to $\lambda n$ are multiplexed, and thus the optical wavelength division multiplexed signal is produced.

On the other hand, each optical signal of wavelength $\lambda 1$ to $\lambda n$, which is outputted from each light source substrate Ch1 to Chn respectively, are given to the duplexer 1. The duplexer 1 duplexes these optical signals and produces duplexed optical signal. This duplexed optical signal is given to a dispersion generating circuit 2.

At the dispersion generating circuit 2, wavelength dispersion occurs on the inputted duplexed optical signal. For example, the dispersion generating circuit 2 can be configured by a dispersion compensating fiber (DCF), or a chirped fiber bragg grating (CFBG). The detailed configuration of the dispersion generating circuit 2 will be explained later. Thus, the duplexed optical signal with dispersion is applied to a photo-detector 3.

The photo-detector 3 converts the duplexed optical signal into electric signal. Namely, the photo-detector 3 generates electric current corresponds to electric power of the duplexes optical signal. The photo-detector 3 further converts the electric current into voltage. For this current-voltage conversion, the photo-detector 3 has resistance (not shown). At the photo-detector 3, sine waves of angle speed $\omega 1$ to $\omega n$ which each modulating signal generator CW1 to CWn intensity modulated are demodulated. As a result, n-multiplexed electrical signal (voltage) is outputted from the photo-detector 3. This n-multiplexed electrical signal is applied to an amplifier 4.

The amplifier 4 amplifies the n-multiplexed electrical signal. The output of the amplifier 4 is fed to a plurality of phase difference detector P1 to Pn. These phase difference detector P1 to Pn respectively provides bandpass filter BPF, mixer MIX and lowpass filter LPF. For example, phase difference detector P1 provides a bandpass filter BPF1, a mixer MIX1 and a lowpass filter LPF1.

Each bandpass filter BPF extracts, among the n-multiplexed electrical signal, an electrical signal with a sine wave of the assigned angle speed $\omega$. Each mixer MIX multiplies the output of each bandpass filter BPF and the sine wave of angle speed $\omega 1$ to $\omega n$ outputted from the modulating signal generator CW. As a result, the mixer MIX outputs the element that an angle speed amounted twice and a direct current element. These elements are given to lowpass filter LPF. At the lowpass filter LPF, only the direct current element passes.

As a result, each phase difference detector P1 to Pn outputs a direct current element for each channel. To the phase difference detector P1 to Pn, comparators R1 to Rn are coupled respectively. Therefore, the direct current element outputted from each phase difference detector P1 to Pn is applied to corresponding comparator R1 to Rn. These comparators R1 to Rn compares output of corresponding lowpass filter LPF with reference voltage. A plurality of reference voltage Vr1 to Vrn are provided for this purpose. Namely, the reference voltage Vr1 is assigned and applied to the comparator R1, the reference voltage Vr2 is assigned and applied to the comparator R2. The remaining comparators are also assigned reference voltage respectively. The output of these comparators R1 to Rn are fed back to the respective temperature control circuit TEC1 to TECn as control signal.

Now, detailed operation of the first embodiment is explained hereinbelow. According to FIG. 1, each light source LD1 to LDn respectively outputs optical signal of wavelength $\lambda 1$ to $\lambda n$. Each modulating signal generator CW1 to CWn intensity modulates respective output of the light source LD1 to LDn, by predetermined sine wave of angle frequency $\omega 1$ to $\omega n$, in other words, by SIN $\omega 1 t$ to SIN $\omega n t$. A part of each optical signal of wavelength $\lambda 1$ to $\lambda n$ are given to the duplexer 1. The duplexer 1 duplexes these optical signal and produces duplexes optical signal.

Figure 2A:
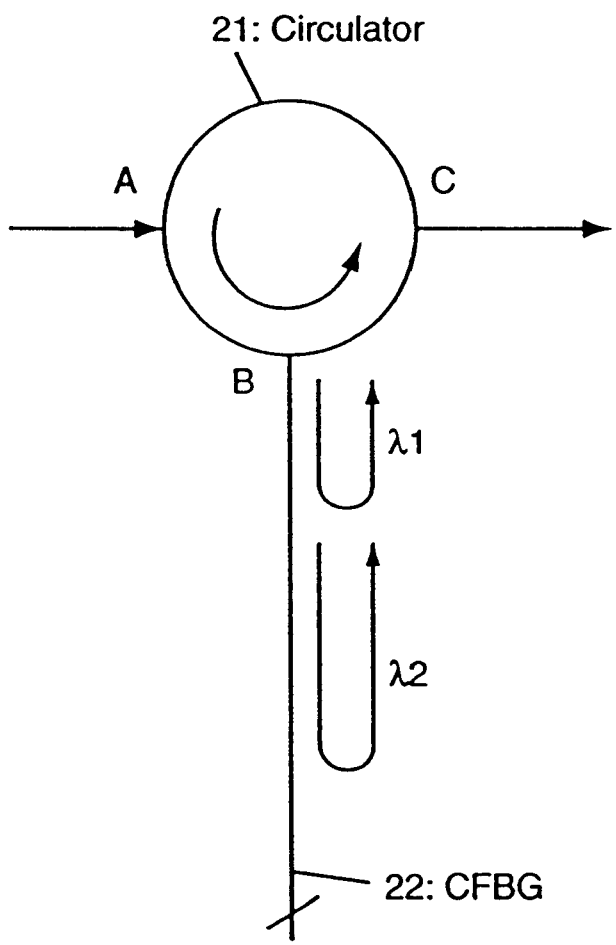
FIG. 2 shows a configuration of the dispersion generating circuit and function thereof.
Figure 2B:
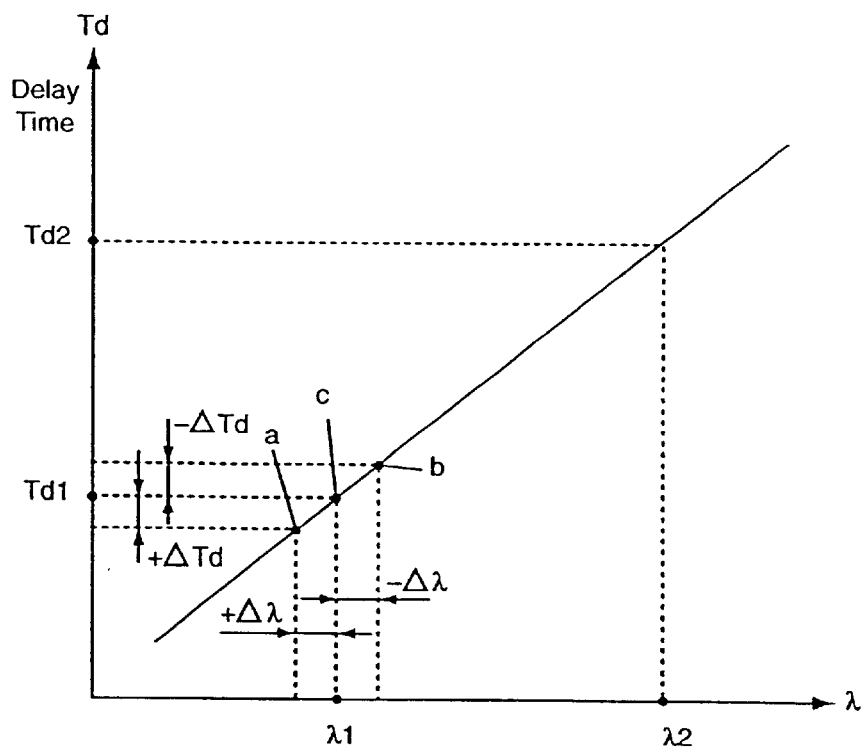

Here, detailed configuration of the dispersion generating circuit 2 and theory thereof are explained below, using FIG. 2. Here, FIG. 2(a) shows a block diagram of the dispersion generating circuit 2 while FIG. 2(b) is a chart showing the relationship between wavelength λ and delay time Td. In FIG. 2(b), wavelength λ is plotted on a horizontal axis while delay time Td is plotted on a vertical axis. In this embodiment, the CFBG is used as the dispersion generating circuit 2.

The dispersion generating circuit 2 has a circulator 21 and a CFBG 22. The circulator 21 has, for example, three ports A, B, and C as shown in FIG. 2(a). In this case, an optical signal inputted into the port A is outputted from the port B, while an optical signal inputted into the port B is outputted from the port C.

The CFBG 22 is made of an optical fiber. On a core of the fiber, a portion with higher refractive index and another portion with lower refractive index are formed repeatedly in a minute interval along the length on the core. Thus, a diffraction lattice is formed. Now, assume that the CFBG 22 is connected to the port B of the circulator 21 and that minute interval of the diffraction lattice on the CFBG 22 increases as goes away from the port B. Further, assume that two optical signals of wavelength λ1 and λ2 (λ1<λ2) are inputted to the port A.

These two optical signals of wavelength λ1 and λ2 are outputted from the port B, and applied to the CFBG 22. Then, these two optical signals are reflected by the diffraction lattice formed in CFBG 22. Since the minute interval of the diffraction lattice increases as goes away from the port B, the signal of wavelength λ2 delays and returns to the port B, in comparison with the signal of wavelength λ1. As mentioned above, such relationship between wavelength λ and delay time Td is shown in FIG. 2(b). It will be understood that delay time Td becomes big, as wavelength λ becomes big.

The duplexes optical signal which was dispersed dispersion generating circuit 2 is converted into an electrical signal by the photo-detector 3. The converted electrical signal is amplified at the amplifier 4 and then applied to the respective phase difference detector P1 to Pn. When the duplexes optical signal is converted into the electrical signal, each optical signal of wavelength λ1 to λn is also detected. It is therefore, in the electrical signal obtained at the photo-detector 3, n sine wave of SIN ω1t to SIN ωnt, that are outputs of the modulating signal generator CW are multiplexed. However, as mentioned above, the delay time of each channel are different each other. An absolute phase of θ1 to θn is therefore added to optical signal on each channel respectively. As a result, output of photo-detector 3 becomes the multiplexed electrical signal which became SIN(ω1t+θ1) to SIN(ωnt+θn).

Each bandpass filter BPF1 to BPFn extracts, among the n-multiplexed electrical signal, an electrical signal with sine wave of the assigned angle speed ω. For simplify the explanation, only the Ch1 will be explained hereinafter. As explained above, the electrical signal which passed the bandpass filter 3 is the signal which approximated to SIN (ω1t+θ1). Here, θ1 is the value indicating the delay time by an absolute phase, the delay occurs on the optical signal of Ch1 at the dispersion generating circuit 2. Between the delay time and the absolute phase, there is the relationship of θ1=2π·Td/λ1.

To the mixer MIX1, the bandpass filter BPF1 applies signal which approximated to SIN(ω1t+θ1), while the modulating signal generator CW1 applies signal of sin ω1t. The mixer MIX1 multiplies these two signals. Then, the mixer MIX1 outputs 2 elements of -SIN(2ω1t+θ1) and SIN θ1 as the principal ingredient. In order here to simplify explanation, output amplitude of the mixer MIX1 is adjusted and normalized on 1. Only the element of SIN θ1 passes the lowpass filter LPF1. This element of SIN θ1 is the level signal approximated to a direct current, and the level thereof depends on delay time Td1 for wavelength λ1 of optical signal on Ch1. The output of the lowpass filter LP1 is given to comparator R1 as a level signal.

The comparator R1 compares the level signal with the reference voltage Vr1. The reference voltage Vr1 is set to a value of the level signal which corresponds to delay time Td1 (FIG. 2(b)), namely, SIN θ1=SIN(2π−Td1/λ1). Output of the comparator R1 is fed back to the temperature control circuit TEC1 as a control signal. The temperature control circuit TEC1 functions as follows.

When the revel signal is lower than the reference voltage Vr1 ("a" in FIG. 2(b)), the temperature control circuit TEC1 controls the light source LD1 so as to decrease laser frequency of the light source LD1 and thus the wavelength λ1 increases Δλ. As a result, delay time Td1 increases ΔTd and goes to "c" in FIG. 2(b). On the other hand, when the revel signal is higher than the reference voltage Vr1 ("b" in FIG. 2(b)), the temperature control circuit TEC1 controls the light source LD1 so as to increase laser frequency of the light source LD1 and thus the wavelength λ1 decreases Δλ. As a result, delay time Td1 decreases ΔTd and goes to "c" in FIG. 2(b).

In this way, a wavelength of optical signal output of the light source LD1 of Ch1 is controlled on λ1 automatically. For example, as an experimental value, an output change of comparator R1 is about 1 mV when the wavelength λ1 changes 1 pm. Here, assume that the frequency of the modulating signal generator CW is 100 MHz, and the dispersion generating circuit 2 has dispersion characteristic of 1000 pSec/nm. In the similar manner, frequencies of light source LD2 to LDn are controlled respectively automatically.

In the first preferred embodiment, as explained above, frequency of each light source LD1 to LDn is controlled based on the delay time occurring at the dispersion generating circuit 2. Therefore, it becomes possible that frequency of the each light source LD1 to LDn can be selected freely. If a delay time error occurs between output wavelength of the light source LD1 to LDn, the error can be absorbed easily by adjusting the reference voltage which is applied to the comparator R1 to Rn individually.

According to the first preferred embodiment, a mach-zehnder filter is not needed. Therefore, the heater for dizzering is not needed. As a result, influence by a temperature to peripheral device is not caused. And, total cost of the apparatus becomes lower.

Figure 3:
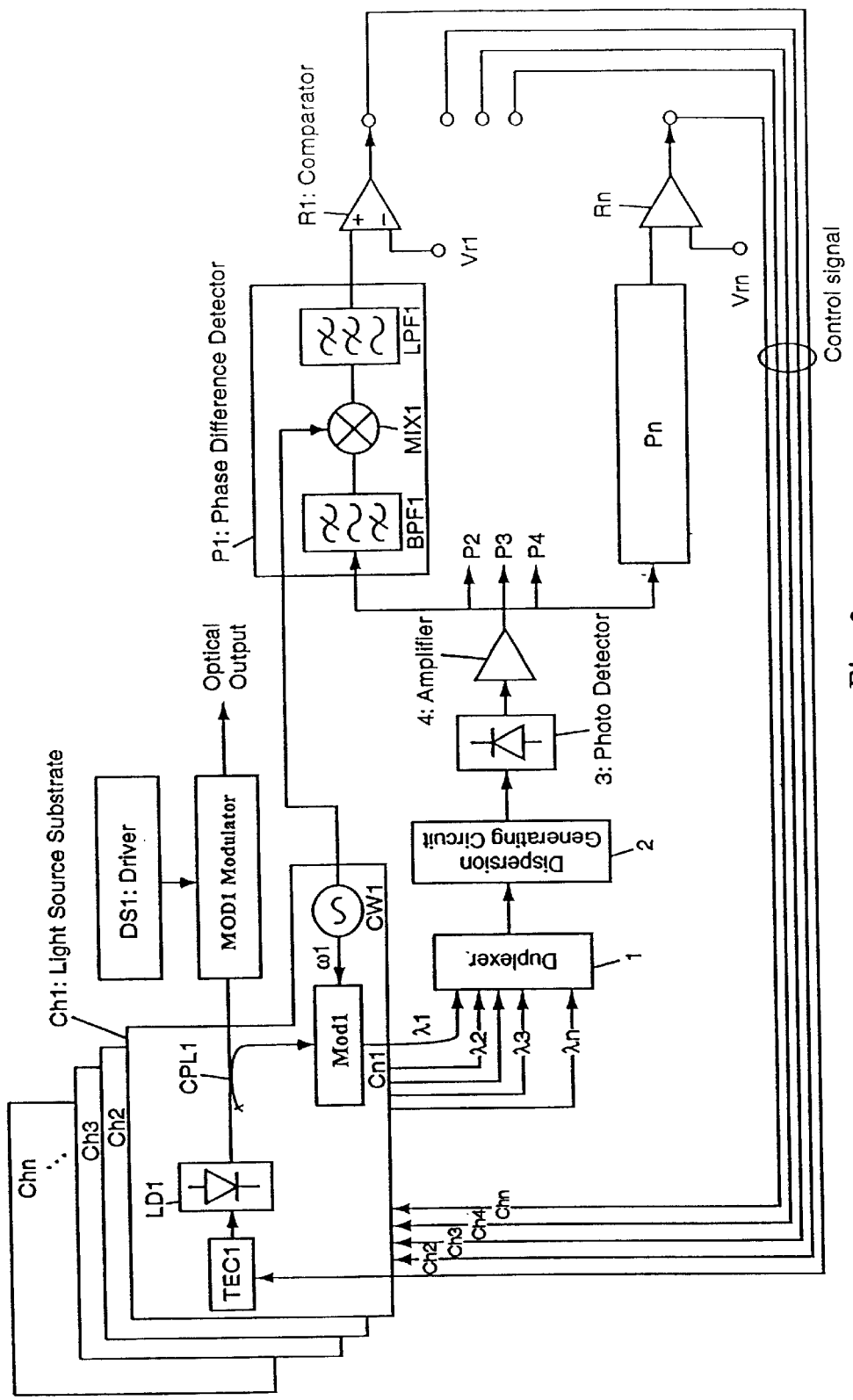
FIG. 3 shows a block diagram of the second preferred embodiment of this invention.

Next, the second preferred embodiment of this invention is explained hereinbelow. FIG. 3 shows a block diagram of the second preferred embodiment of this invention. In FIG. 3, a WDM light source generates n-multiplexed optical signal, in which n-channels are multiplexed. The WDM light source has n light source substrates. Each light source substrate generates an optical signal for each channel, respectively.

For example, a light source LD1 which generates an optical signal of wavelength λ1 is mounted on the light source substrate Ch1. The light source substrate Ch1 further has a temperature control circuit TEC1, a modulating signal generator CW1, and a modulator MOD1. The output of the temperature control circuit TEC1 is fed to the light source LD1. The output of the light source LD1 is applied to a first modulator MOD1. At the first modulator MOD1, the output of the light source LD1 is intensity modulated.

At the same time, part of the output of the light source LD1 is divided at a coupler CPL1 and is given to a second modulator mod1. To the second modulator mod1, the modulating signal generator CW1 is connected. The modulating signal generator CW1 applies a sine wave with predetermined angle speed $\omega 1$ to the second modulator mod1. The output of the second modulator mod1 is applied to the duplexer 1.

In the first proffered embodiment, the modulating signal generator CW1 directly modulates the light source LD1. In the contrary, the modulating signal generator CW1 modulates the divided signal by the second modulator mod1. Namely, in the second embodiment, the output of the light source LD1 is directly applied to the first modulator MOD1. In other words, the output of the light source LD1 is continuous wave.

The remaining light source substrate Ch2 to Chn has similar configuration to that of the light source substrate Ch1. Further, though they are not shown in FIG. 3, the WDM light source has first modulators MOD2 to MODn, and drivers DS2 to DSn, each correspond to Ch2 to Chn.

Each output from the second modulator modi to modn are multiplexed at the duplexer 1. This duplexes optical signal is given to a dispersion generating circuit 2. The other configuration is similar to the first embodiment.

In the second embodiment, the output of the light source LD1 is continuous wave, and this continuous wave is modulated by the modulating signal generator CW1. Therefore, frequency of each light source LD becomes more stable and thus more efficient control can be performed.

Figure 4:
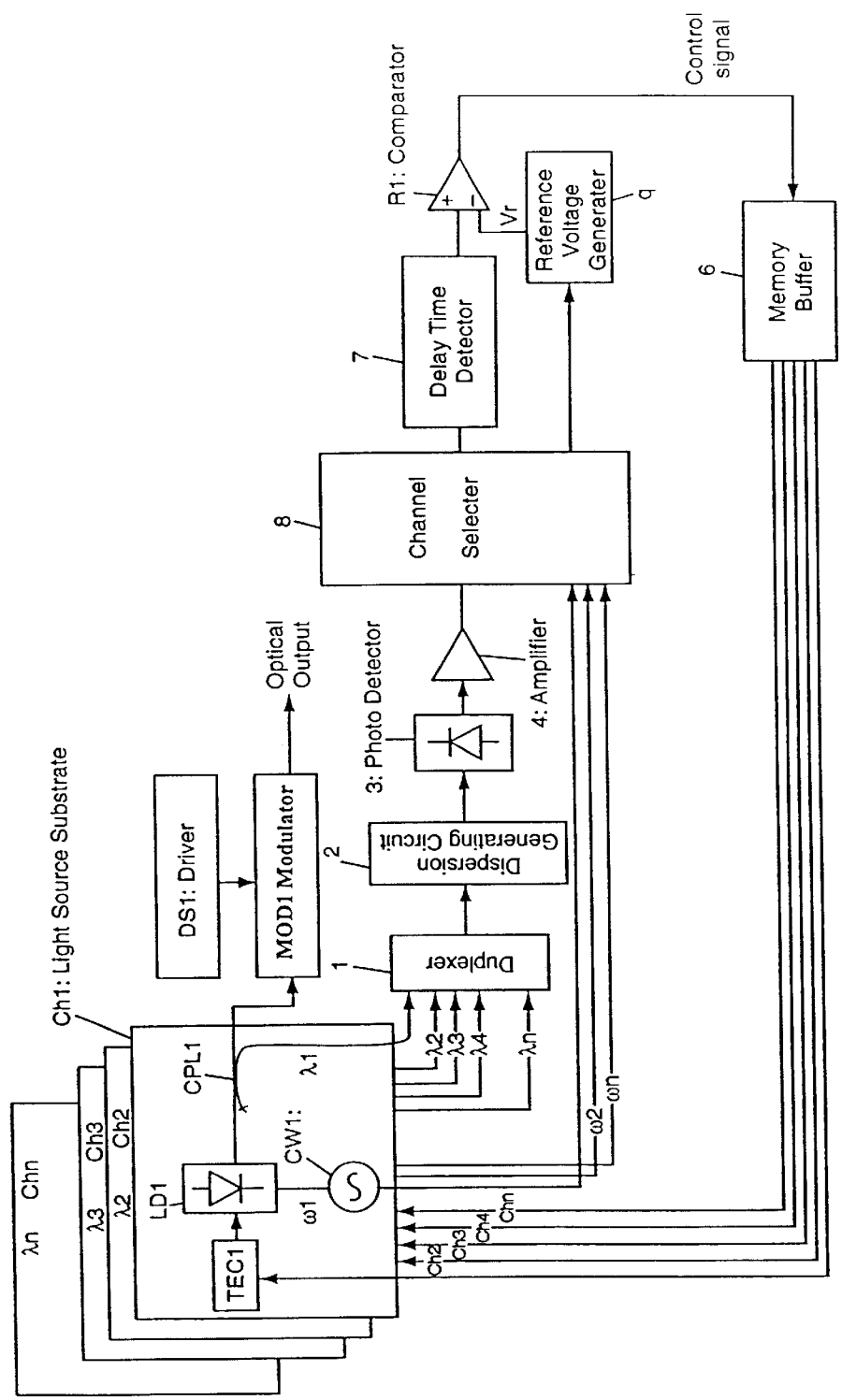
FIG. 4 shows a block diagram of the third preferred embodiment of this invention.

Next, the third preferred embodiment of this invention is explained hereinbelow. FIG. 4 shows a block diagram of the third preferred embodiment of this invention. In the third embodiment, a WDM light source does not detect phase difference for every channel individually, but the plurality of channels share some of hardware. In FIG. 4, a WDM light source generates n-multiplexed optical signal, in which n-channels are multiplexed. The WDM light source has n light source substrates. Each light source substrate generates an optical signal for each channel, respectively.

In the third embodiment, a channel selector 8 is coupled to the amplifier 4. Next to the channel selector 8 a delay time detector 7 is coupled. Output of the delay time detector 7 is applied to the comparator R1. A reference voltage generator 9 is coupled to the comparator R1. Output of the comparator R1 is once stored in a memory buffer 6, the output thereof is applied to the each light source substrate Cn1 to Chn as a control signal for controlling the temperature control circuit TEC for individual channel. Sine wave of angle speed $\omega 1$ to $\omega n$ is input to the channel selector 8. And, the selecting signal is applied to the reference voltage generator 9 from the channel selector 8.

Figure 5:
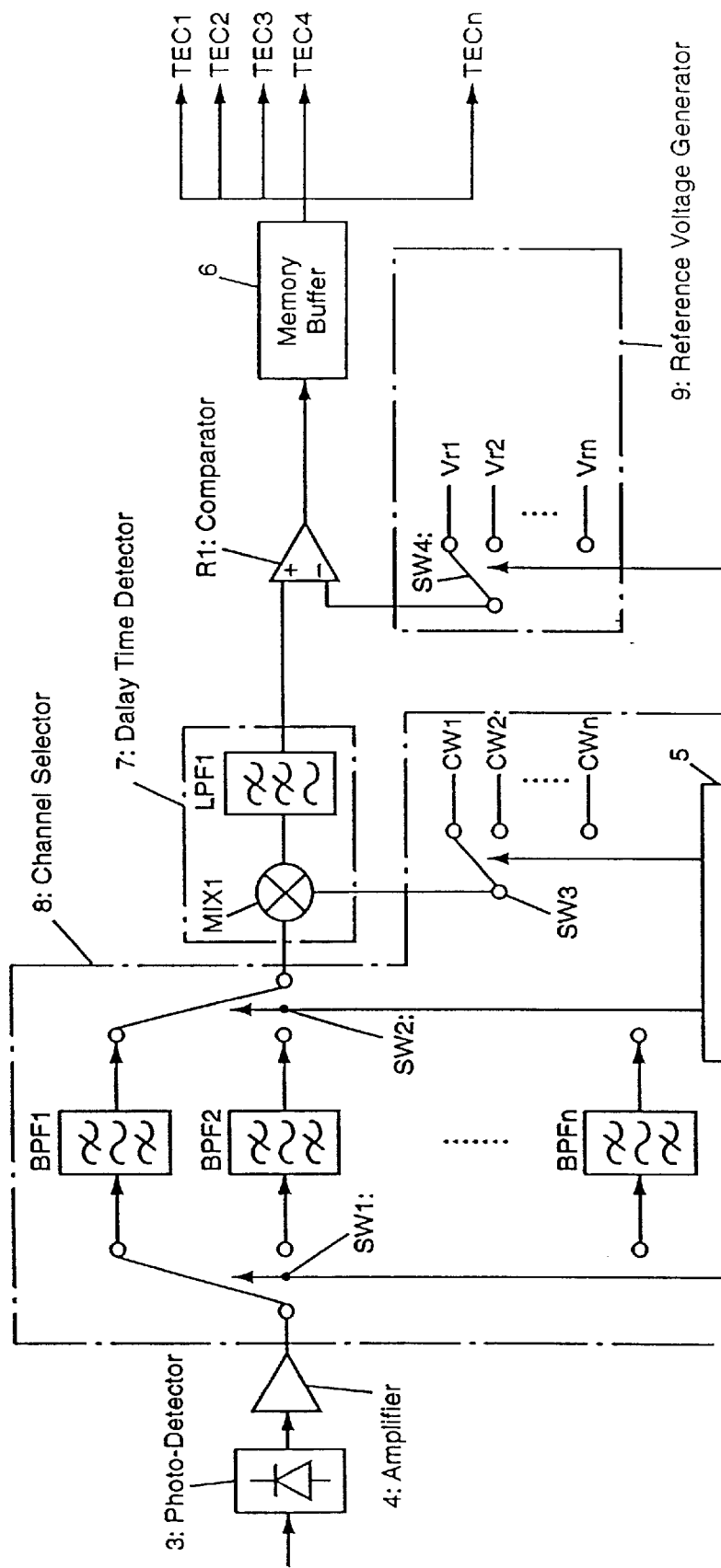
FIG. 5 shows a detailed block diagram of the third preferred embodiment.

Now, in FIG. 5, the detailed configuration of the channel selector 8, the delay time detector 7, comparator R1 and the reference voltage generator 9 is explained below.

The channel selector 8 couples the output of the amplifier 4 to one of the bandpass filter BPF. Namely, the channel selector 8 has n, which is the same number to the channels the WDM light source has, bandpass filters BPF1 to BPFn. The channel selector 8 further has a switch SW1 and a switch SW2. The switch SW1 is placed at an input side of the bandpass filters while the switch SW2 is placed at an output side of the bandpass filters. These switch SW1 and switch SW2 cooperate together, and thus one of the bandpass filter BPF is coupled to the amplifier 4 and the delay time detector 7.

The channel selector 8 comprises a switch controller 5 to switch the switch SW1 and the switch SW2. The channel selector 8 further comprises a switch SW3 to select one of the sine wave given from the modulating signal generator CW. The selected sine wave by the switch SW3 is applied to the delay time detector 7.

The delay time detector 7 is formed by the mixer MIX1 and the lowpass filter LPF1. To the mixer MX1, output of the switch SW2 is applied. Output of the mixer MX1 is coupled to the comparator R1. A plurality of reference voltage Vr1 to Vrn are provided in the reference voltage generator 9. Each reference voltage is assigned to each channel, respectively. Further, the reference voltage generator 9 has a switch SW4 for coupling one of the reference voltages to the mixer MIX1. The switch SW4 is operated according to the selecting signal applied from the switch controller 5.

Operation of the switching is explained hereinbelow. First, when frequency control for Ch1 is carried into effect, the switch controller 5 respectively connects the switch SW1 and the switch SW2 to the bandpass filter BPF1. Further, the switch controller 5 respectively connects the switch SW3 to the modulating signal generator CW1, and the switch SW4 to the reference voltage Vr1. As a result, to the mixer MIX1, the sin wave approximated to $SIN(\omega 1 t+\theta 1)$ is applied. At the same time, the sin wave $SIN \omega 1 t$ is applied from the modulating signal generator CW1, via the switch SW3. The mixer MIX1 multiplies these sine waves and outputs 2 elements of $SIN(2\omega 1 t+\theta 1)$ and $SIN \theta 1$ as the principal ingredient.

Output of the mixer MX1 is applied to the lowpass filter LPF1, and only the element of $SIN \theta 1$ passes the lowpass filter LPF1. The output of the lowpass filter LPF1 is applied to the comparator R1 as the level signal. The comparator R1 compares the level signal with the reference voltage Vr1 which was applied from the reference voltage generator 9. The result of this comparison is fed back to the temperature control circuit TEC1.

When the switching operation is done and frequency control for Ch1 is carried in this manner, then the switch controller 5 performs frequency control for Ch2. For frequency control for Ch2, the switch controller 5 respectively switches the switch SW1, the switch SW2, the switch SW3 and the SW4. Thus, frequency control for Ch2 is performed. Subsequently, frequency control for Ch3 is performed. Similarly, frequency control for all channels are performed. In the other words, the switch controller 5 performs frequency control for each channel cyclically. After frequency control for every channel is done, the switch controller 5 performs again frequency control for Ch1. The memory buffer 6 stores the control signal for each channel during the cycle. In other words, the control signal for a certain channel is rewritten when the next frequency control for the channel starts. Since a certain time is needed for the frequency control for one channel, the memory buffer 6 is necessary in order to absorb this time.

As explained above, it is noted that the mixer MIX, the lowpass filter LPF, and the comparator R for each channel has identical characteristic in all channels. Therefore, according to the third embodiment, a plurality of the channels share such common hardware. It is possible to reduce parts and cost of the WDM light source apparatus.

Figure 6:
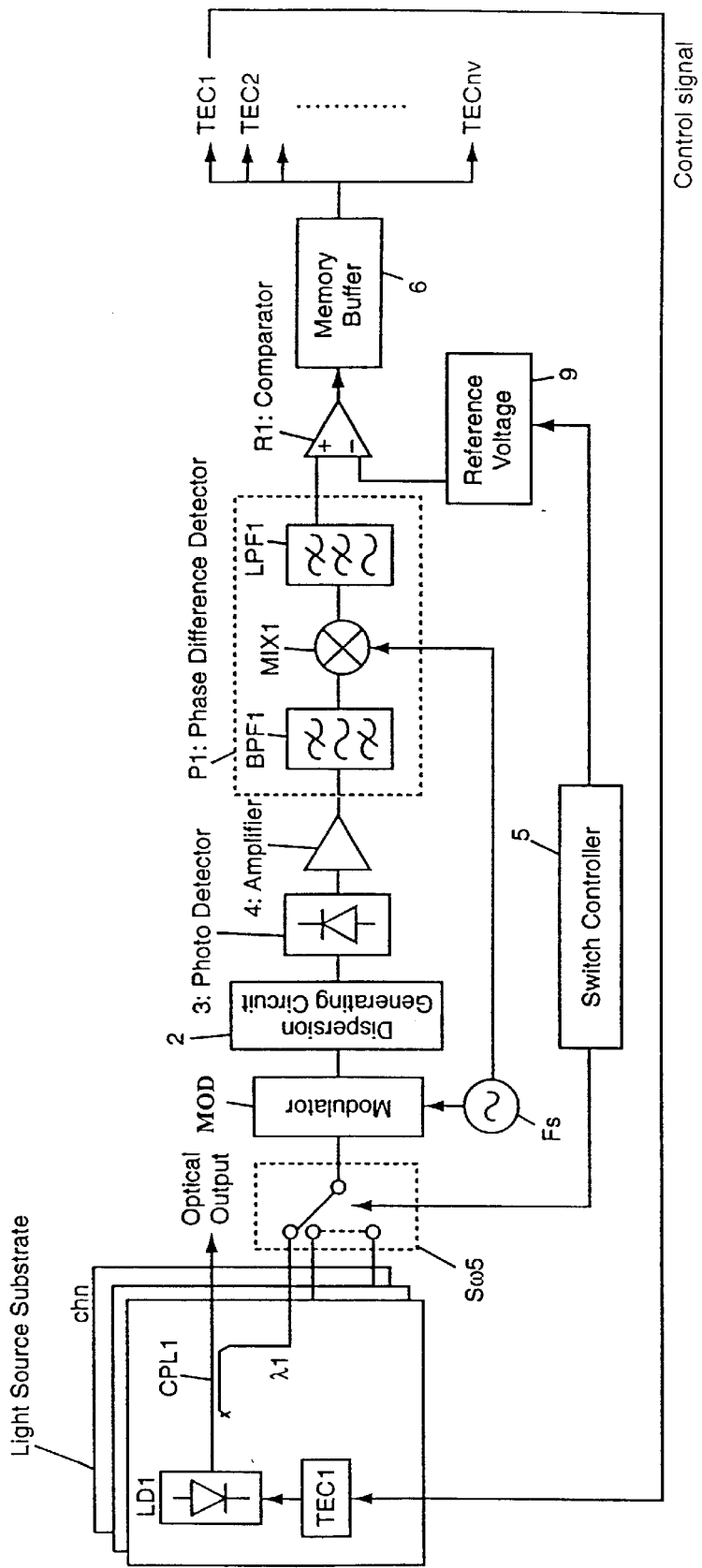
FIG. 6 shows a block diagram of the fourth preferred embodiment of this invention.

Next, the fourth preferred embodiment of this invention is explained hereinbelow. FIG. 6 shows a block diagram of the fourth preferred embodiment of this invention. In the fourth embodiment, the WDM light source has n light source substrates. Each light source substrate generates an optical signal for each channel, respectively. The light source substrate Ch1 has light source LD1, a temperature control circuit TEC1 and a coupler CPL1. In this embodiment, the output of the light source LD1 is continuous wave. The remaining light source substrate Ch2 to Chn has similar configuration to that of the light source substrate Ch1. Each output from the light source LD1 to LDn are multiplexed. Thus the optical wavelength division multiplexed signal is produced.

At the same time, part of the output of the light source LD1 is divided by the coupler CLP1. The divided optical signal is applied to a switch SW5. Similarly, each divided signal from the light source LD2 to LDn is, applied to the switch SW5. The switch SW5 is coupled to a modulator MOD. Other optical signals from the light source LD2 to LDn are also applied to the modulator MOD, via the switch SW5. The switch SW5 selects one of the optical signal among the light source LD1 to LDn outputs, and applies the selected optical signal to the modulator MOD. To the modulator MOD, the modulating signal generator Fs is connected. The modulating signal generator Fs applies sine wave to the modulator MOD, thus the modulator MOD intensity modulates the applied optical signal.

The output of the modulating signal generator Fs is applied to the dispersion generating circuit 2. The output of the dispersion generating circuit 2 is applied to the photo-detector 3, and converted to electrical signal. The converted electrical signal is then applied to the amplifier 4 and is amplified. Thus, amplified electrical signal is applied to the phase difference detector P1 are the same to that of the first preferred embodiment, so detailed explanation is omitted. Next to the phase difference detector P1, the comparator R1 is coupled. The output of the lowpass filter LPF1 is applied to the comparator R1 as the level signal. Further, the reference voltage generator 9 is coupled to the comparator R1.

The comparator R1 compares the level signal with the reference voltage Vr1 which was applied from the reference voltage generator 9. The result of this comparison is fed back to the temperature control circuit TEC1. The switching operation of the fourth embodiment is similar to the third embodiment, so the detailed explanation is omitted.

According to the fourth embodiment, the modulator and the modulating signal generator, in addition to the mixer and the comparator, are shared by a plurality of channels. As a result, further reduction of parts and cost of the WDM light source apparatus is possible.

Figure 7:
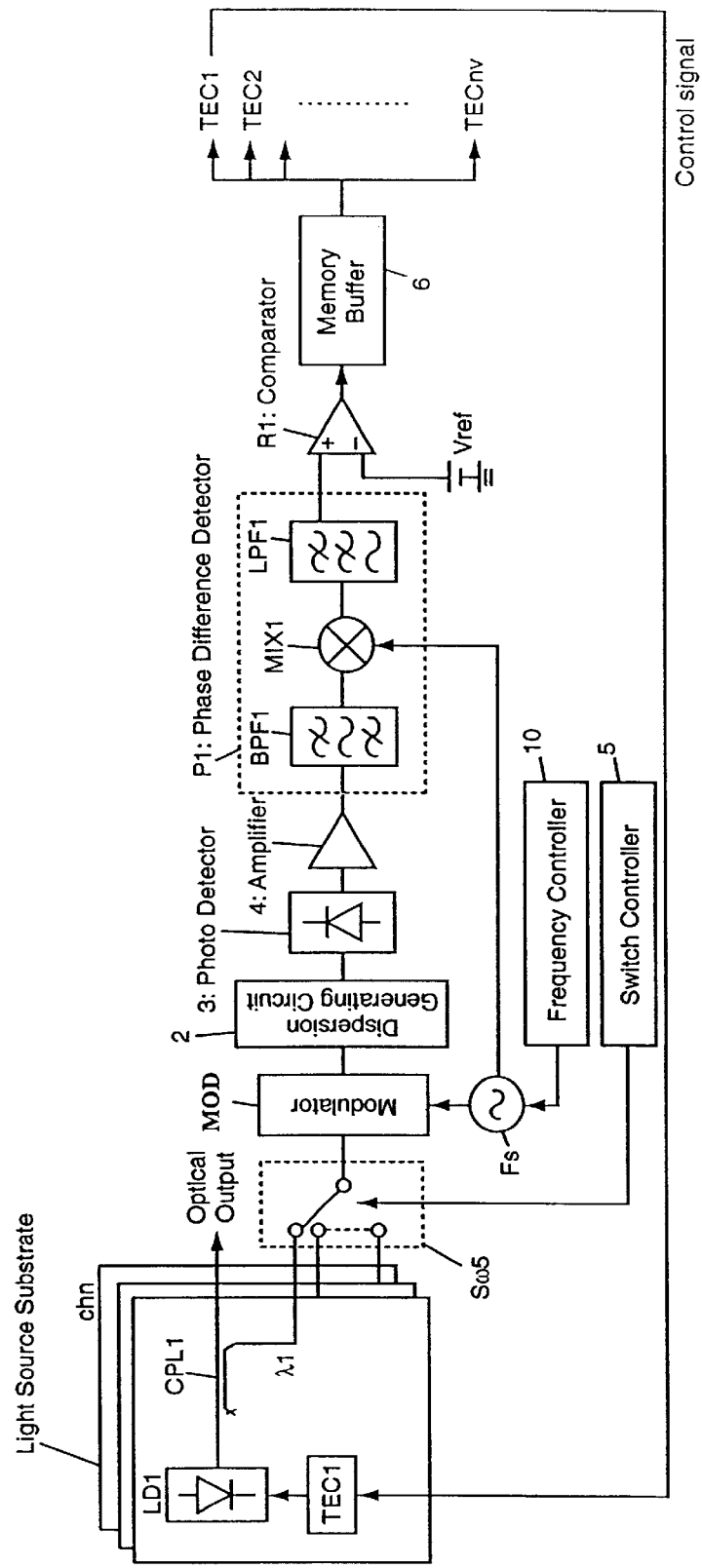
FIG. 7 shows a block diagram of the fifth preferred embodiment of this invention.

Next, the fifth preferred embodiment of this invention is explained hereinbelow. FIG. 7 shows a block diagram of the fifth preferred embodiment of this invention. The fifth embodiment has similar configuration to that of the fourth embodiment. The difference between the fourth and the fifth embodiment is that a frequency controller 11 is disposed in the fifth embodiment. The frequency controller 10 is coupled to the modulating signal generator Fs, and is controlled by the switch controller 5. In the fifth embodiment, the modulating signal generator Fs generates variable frequency. A further difference is that the fixed voltage Vref is applied to the comparator R.

Figure 8:
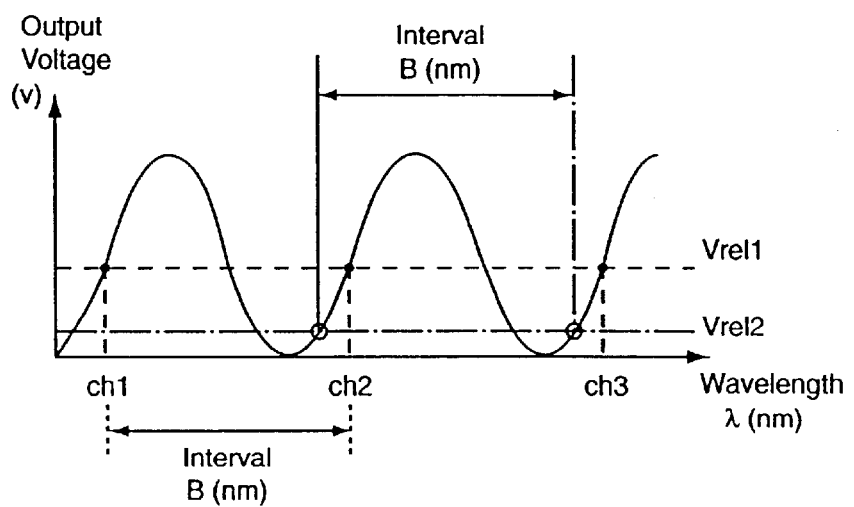
FIG. 8 shows DC output characteristics of the phase difference detector.

The modulating signal generator Fs applies modulating signals to the modulator MOD and the mixer MIX1. The frequency controller 10 instructs the modulating signal generator Fs which frequency should be applied to the modulator MOD. Now, operation of the fifth embodiment is explained hereinbelow. FIG. 8 is a chart showing the DC output characteristics. Here, a horizontal axis is showing a wavelength λ of each light source LD1 to LDn while a vertical axis is showing DC output voltage of the phase-difference detector P1.

Assume that a lean of delay characteristics of dispersion generating circuit 2 is A (psec/nm), and that an interval of frequency of each light source B (nm), delay time difference between individual channel Y becomes A·B (psec). And, since a sine wave of a fixed period is applied to the mixer MIX1, the output of the phase difference detector 4 also amounts periodic function as shown in FIG. 8. Therefore; by determining the frequency of the modulating signal Fs preferably, period Ts of the modulating signal and the delay time difference Y can be equalized. At this time, intersection interval of the DC output characteristics of the phase difference detector P1 and the reference voltage becomes fixed B (nm), regardless of the reference voltage Vref.

In FIG. 8, two kinds of reference voltage Vref1 and Vref2 are indicated. It will be understood that, the intersection interval and the reference voltage is the same B (nm) in each case. At this time, the frequency of the modulating signal generator Fs can be shown in next equation (1).

$$Fs=(1/Ts)=(1/Y)=1*10^{12}/A \cdot B(Hz) \quad (1)$$

According to the fifth preferred embodiment, the frequency controller 10 is added to the WDM light source, and the laser frequency of the modulating signal generator Fs is variable. Further, by determining the frequency of the modulating signal Fs according to the interval of frequency of the plurality of light source and the DC output characteristics of the phase difference detector. Therefore, the plurality of channels can share the reference voltage Vr during the frequency control for each channel. In addition, when a wavelength interval of the plurality of light source LD is about to be changed, it is easily achieved because each laser frequency is not needed to individually reset, but only the modulating signal Fs is reset.

Figure 9A:
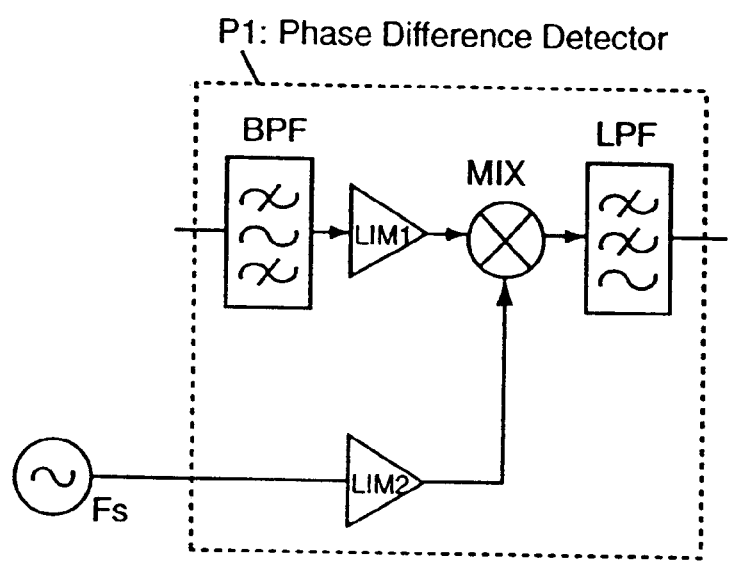

FIG. 9 shows another block diagram of the phase difference detector P1. Here, FIG. 9(a) shows the block diagram while FIG. 9 (b) shows DC output characteristics thereof.

As mentioned, the fifth embodiment provides a WDM light source with intersection interval becomes fixed B (nm), regardless of the reference voltage Vref. However, in case the reference voltage Vref is Vref2, the lean at the intersection point is small. Detection sensitivity of aphase difference gets worse on such a case and precision of frequency control is likely to fall.

Accordingly, the configuration of FIG. 9 provides more stable control regardless of the reference voltage.

Accordingly, the phase difference detector P1 shown in FIG. 9(a) has a limitter-AMP LIM1 is coupled after the bandpass filter BPF1. Output of the limitter-AMP LIM1 is applied to the mixer MIX1. The phase difference detector P1 further has another limitter-AMP LIM2 after the bandpass filter BPF2. Output of the limitter-AMP LIM2 is also applied to the mixer MIX1.

Figure 9B:
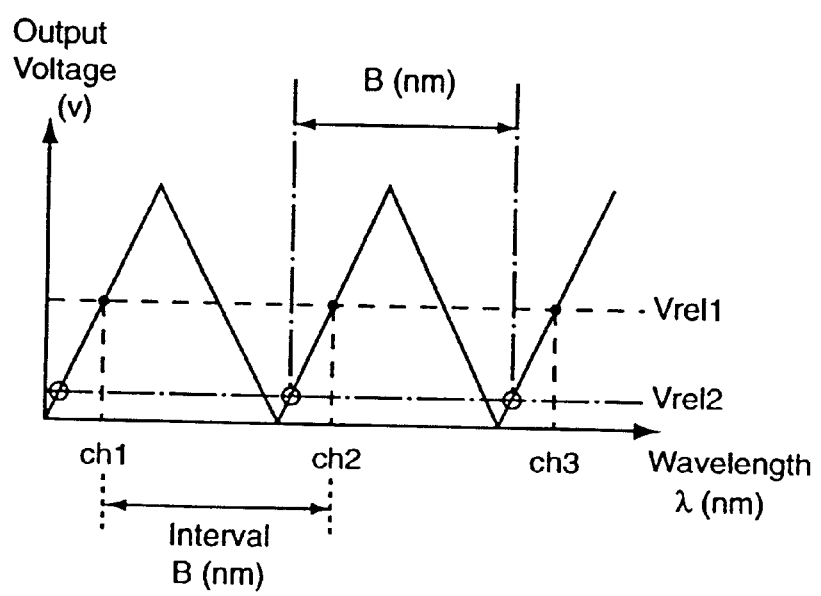
FIG. 9(b) shows DC output characteristics thereof.

The limitter-AMP LIM1 and the limitter-AMP LIM2 respectively converts the inputted sine wave into pulse trains with 50% duty ratio. These pulse trains are applied to the mixer MIX1. The mixer MIX1 multiplies these pulse trains and outputs a rectangular signals as shown in FIG. 9(b). This becomes output of phase difference detector P1. Therefore, even if the reference voltage lays at any level, the lean at the intersection point becomes a certain amount. Thus, detection sensitivity of the phase difference does not influenced and precision of frequency control is secured.

Figure 10:
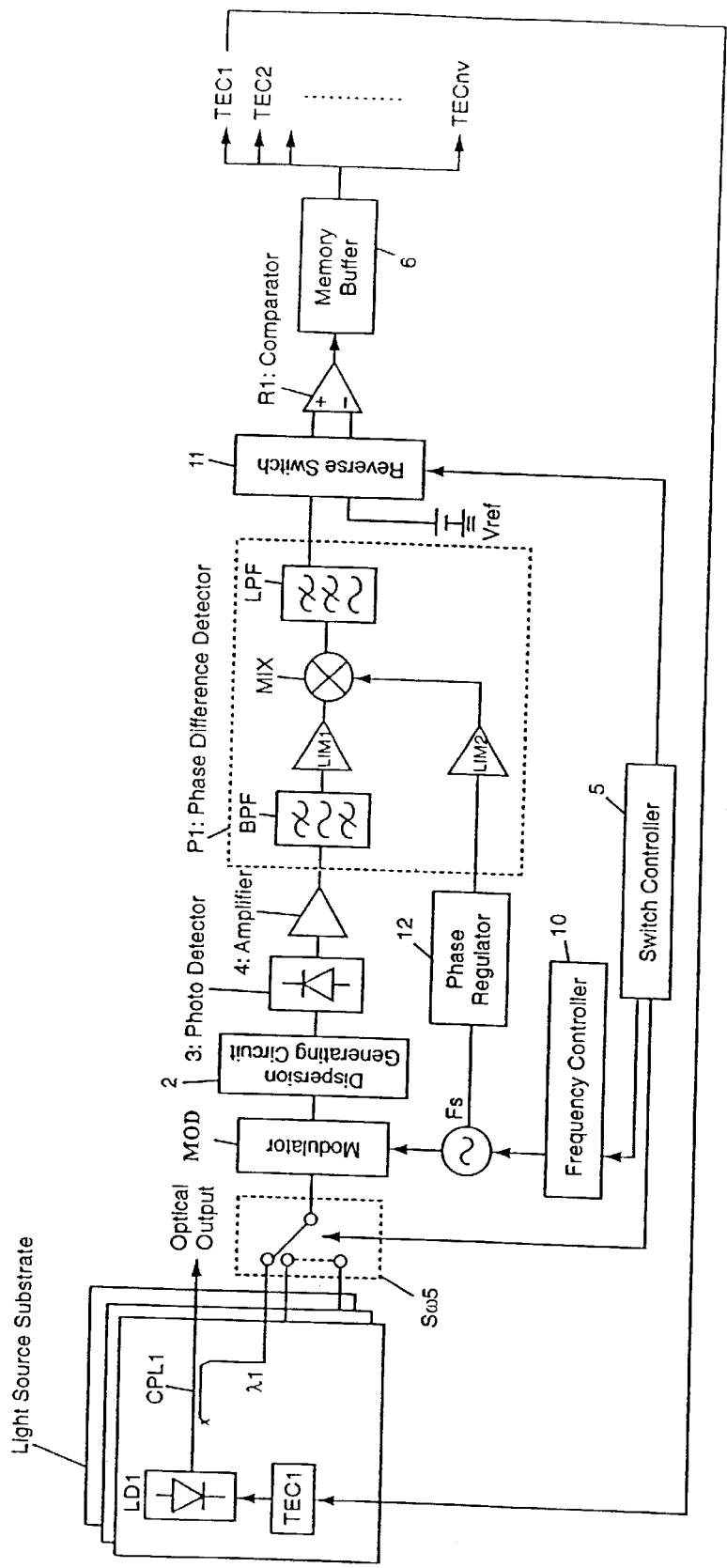
FIG. 10 shows another block diagram of the fifth preferred embodiment.

Now, a further modified block diagram of the fifth embodiment is shown in FIG. 10. A reverse switch 11 is placed after the phase difference detector P1. The switch controller 5 controls the reverse switch 11 in addition to the switch SW5. Here, the reverse switch 11 switches polarity of the output of the lowpass filter LPF and the reference voltage Vref. Moreover, in this modified fifth embodiment, frequency of the modulating signal generator Fs is set to half of the fifth embodiment, namely to the Fs/2.

Output of the modulating signal generator Fs is given to the limitter-AMP LIM2 through a phase regulator 12. The phase regulator 12 delays the output of the modulating signal generator Fs certain time.

Figure 11A:
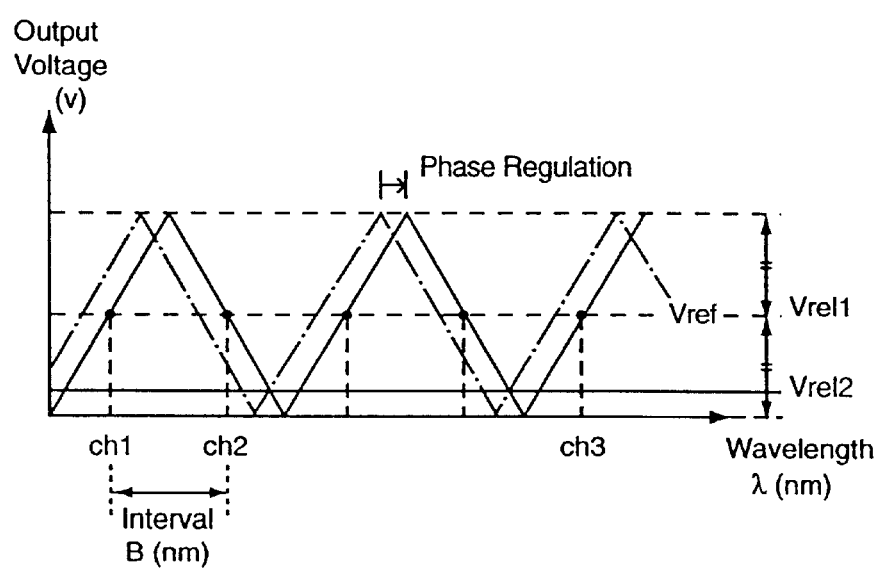

Generally, oscillators which outputs low frequency has relatively simple configuration. As the frequency becomes higher, however, such oscillators has more complicated configuration and relatively high cost. Then, this modified fifth embodiment turns the frequency of the modulating signal into ½ and thus decrease circuit scale. Hereinbelow, function of the modified fifth embodiment is explained, using FIG. 11. Here, FIG. 11(a) shows DC output characteristics of the phase difference detector P1, while FIG. 11(b) shows a block diagram of the reverse switch 11 and output signal thereof.

First, the reference voltage Vref is determined to the center of the amplitude of the DC output voltage of the phase difference detector P1. This is the condition which was shown in FIG. 11(a) in a dotted line. Next, the delay at the phase regulator 12 is adjusted so as to coincide the intersection interval with the wavelength interval of the plurality of light source LD. This is the condition which was shown in FIG. 11(a) in a real line.

In this modified embodiment, frequency of the modulating signal generator Fs becomes half. As a result, as understood from FIG. 11(a), intersection points for each odd number channel is located at an ascending side of the output signal of the phase difference detector P1. While, intersection points for each even number channel is located at an descending side. Then, the polarization of the control signal which is applied to the temperature control circuit TEC is needed to reverse, in a case of odd number channel and a case of even number channel.

Figure 11B:
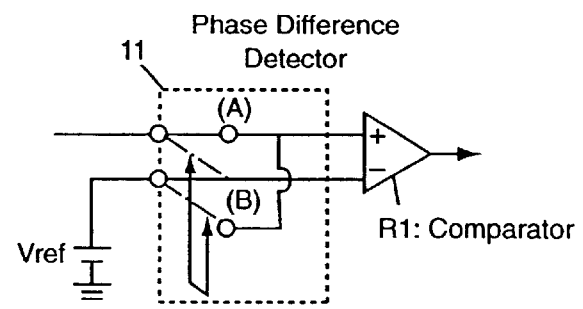
FIG. 11(b) shows function of the reverse switch.
Figure 11B:
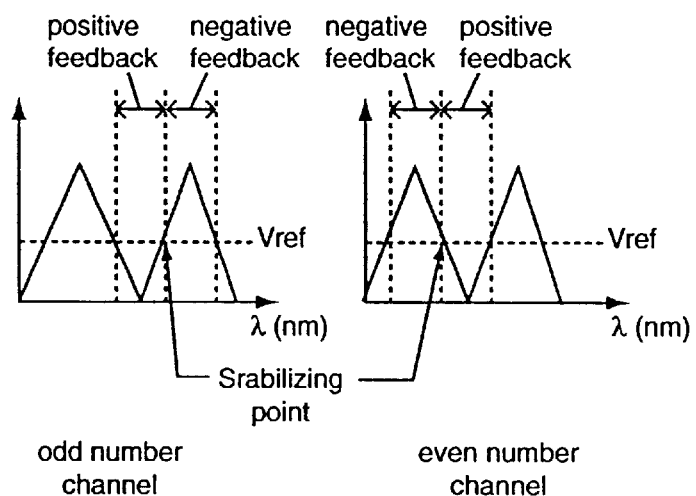

Accordingly, the switch controller 5 actuates the reverse switch 11 to side A in FIG. 11(b), when it couples the odd number channel to the modulator MOD. While, the switch controller 5 actuates the reverse switch 11 to side B when it couples the even number channel to the modulator MOD. As a result, an output voltage of the comparator R1 is determined as shown in FIG. 11(b). For example, when frequency control for odd number channel, output of the phase difference detector P1 is applied to a non-inverse input of the comparator R1, while the reference voltage Vref is applied to an inverse input of the comparator R1. Here, if output frequency of the light source has slipped on the side of a long wavelength, the comparator R1 outputs a positive voltage. As a result, negative feedback is applied to the temperature control circuit TEC, and thus laser frequency of the light source LD raises. Thus, frequency of the light source LD becomes short. When frequency control for even number channel is needed, an opposite control is done.

As explained above, in the modified fifth embodiment, both side (an ascending side and an descending side) of the output signal of the phase difference detector P1 can be utilized for frequency control. By utilizing the both side, frequency of the modulating signal can be reduced into ½. Therefore, configuration of the modulating signal generator Fs becomes simple. Moreover, if such reverse switch is added to an existing system, intervals between each wavelength can be narrowed to half. In other words, it becomes possible to multiple two times than the existing system without changing other parts.

Figure 12:
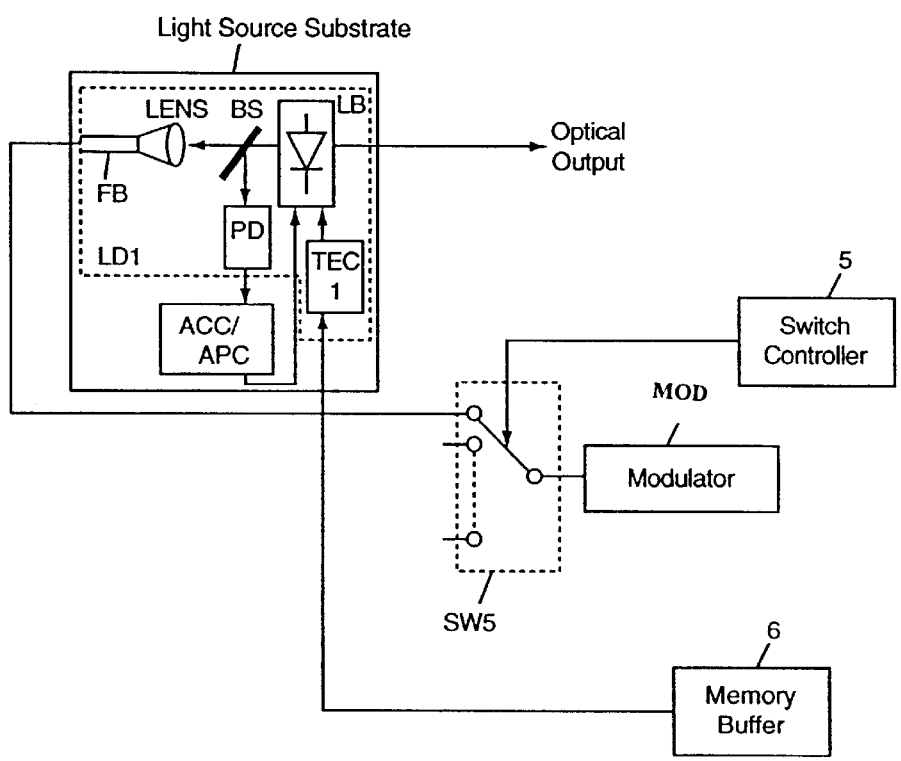
FIG. 12 shows another configuration of the light source substrate.

Finally, another configuration of the light source substrate will be explained using FIG. 12. This configuration utilizes rear emitting light of the light source LD. Here, in the case that the modified light source substrate is adopted to the fifth embodiment will be explained in FIG. 12. Though only one substrate is shown in FIG. 12, the other substrates have similar configuration. Further, only relative blocks are shown in FIG. 12.

The light source LD which is mounted on the light source substrate generates front emitting light and rear emitting light. The front emitting light is outputted as a main signal. On the light source substrate, a lens is placed at the rear side of the light source LD. On the light source substrate, the temperature control circuit TEC1 is mounted. To the temperature control circuit TEC1, the control signal from the memory buffer 6 is applied. A beam spritter BS, a photo-diode PD for monitoring, and an ACC or an APC can be mounted on the light source substrate.

The lens couples the rear emitting light to an optical fiber FB. The optical fiber FB applies the rear emitting light to the switch SW5. The switch SW5 selects one of the output among the plurality of output of the light source LD1 to LDn, and applies it to the modulator MOD.

According to the light source substrate, optical coupler CPL becomes unnecessary. Thus, no loss occurs on the main signal. Moreover, even if the polarization depend type device such as LN modulator is coupled to the light source LD, it is not necessary to use expensive polarization maintaining coupler does not needed.

In the above explanation, the light sources for wavelength division multiplex communication are explained. However, the invention is not limited to the light source for WDM communication. Even though it is a case, of n=1 is within the scope of the invention. Moreover, the dispersion generating circuit is not limited to the configuration which comprises the circulator and the CFBG. The dispersion generating circuit can be a device which has dispersion characteristics. For example, a dispersion compensating fiber can be utilized as the dispersion generating circuit.

In addition, though the modulating signal generator is explained as it intensity modulates the output of the light source by sine wave of angle speed $\omega 1$ to $\omega n$, which is assigned to each channel, the invention is not limited to such configuration. Such intensity modulation has only to be the marker which can distinguish the plurality of optical signals. So, instead to the intensity modulation, the marker may be the pulse signal with own frequency for each channel. In addition, if the number of channel of the switch and the number of the reference voltage are prepared more than the number of the multiplexed channel, it is easy to increase multiple numbers afterward.

What is claimed is:

1. An apparatus for stabilizing the frequency of a light source for optical communication, comprising:

a light source for generating an optical signal, said optical signal having a predetermined wavelength;

a modulator for modulating the optical signal with a marker signal assigned to the optical signal;

a delay generator receiving and delaying the optical signal, said delay generator varying the delay of the optical signal according to the wavelength of the optical signal;

a phase difference detector for detecting the delay of the optical signal;

a control signal generator for generating a control signal according to the delay, and;

a control means for controlling the wavelength of the optical signal according to the control signal.

2. An apparatus according to claim 1 wherein the delay generator comprises a dispersion generator for generating a wavelength dispersion according to the wavelength of the optical signal.

3. An apparatus for stabilizing the frequency of a light source for optical communication, comprising:

a plurality of light sources, each of said light sources generating an optical signal, the wavelength of each optical signal differing from the wavelengths of the other optical signals;

a plurality of modulators, each of said modulators modulating a corresponding one of the optical signals with a marker signal individually assigned to the optical signal;

a delay generator receiving and delaying each optical signal, the delay generator varying the delay of each optical signal according to the wavelength of the optical signal;

a phase difference detector for detecting the delay of each optical signal;

a control signal generator for generating a control signal for each optical signal according to the delay of the optical signal, and;

a control means for controlling the wavelength of each light source according to the corresponding control signal.

4. An apparatus according to claim 3 wherein the apparatus further comprises a duplexer for duplexing the optical signals from said plurality of light sources into a duplexed optical signal, and for applying the duplexed optical signal to the delay generator.

5. An apparatus according to claim 3 wherein the apparatus further comprises an optical-electric converter coupled to the delay generator, for converting the delayed optical signals into an electrical signal.

6. An apparatus according to claim 4 wherein the phase difference detector comprises a mixer for mixing the electrical signal and a corresponding one of the marker signals, thereby extracting the delay of the optical signal modulated with the marker signal.

7. An apparatus according to claim 4 wherein the control signal generator comprises a comparator for comparing the detected delay with a reference value, thereby generating the control signal.

8. An apparatus according to claim 4 wherein the phase difference detector further comprises a plurality of bandpass filters each corresponding to one of the plurality of the light sources, and a switch means for selecting one of the bandpass filters.

9. An apparatus according to claim 8 wherein the control signal generator generates a plurality of reference voltages, each voltage being assigned to a corresponding one of the optical signals; and wherein the switch means further selects one of the reference voltages.

10. An apparatus for stabilizing the frequency of a light source for optical communication, comprising:

a plurality of light sources, each of said light sources generating an optical signal, the wavelength of each optical signal differing from the wavelengths of the other optical signals;

a switch means for selecting one of the optical signals;

a modulator for modulating the selected optical signal with a marker signal;

a delay generator receiving and delaying the selected optical signal from the modulator, said delay generator varying the delay of the selected optical signal according to the wavelength of the selected optical signal;

a phase difference detector for detecting the delay of the selected optical signal;

a control signal generator for generating a control signal according to the delay, and;

a control means for controlling the wavelength of the selected optical signal according to the control signal.

* * * * *